(12) United States Patent
Li

(10) Patent No.: US 10,940,676 B2
(45) Date of Patent: Mar. 9, 2021

(54) ANISOTROPIC CONDUCTIVE FILM, DISPLAY DEVICE AND REWORKING METHOD THEREOF

(71) Applicant: BOE TECHNOLOGY GROUP CO., LTD., Beijing (CN)

(72) Inventor: Hong Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 490 days.

(21) Appl. No.: 15/124,328

(22) PCT Filed: Jul. 29, 2015

(86) PCT No.: PCT/CN2015/085428
§ 371 (c)(1),
(2) Date: Sep. 7, 2016

(87) PCT Pub. No.: WO2016/161719
PCT Pub. Date: Oct. 13, 2016

(65) Prior Publication Data
US 2017/0086310 A1 Mar. 23, 2017

(30) Foreign Application Priority Data
Apr. 7, 2015 (CN) .......................... 2015 1 0160916

(51) Int. Cl.
*H05K 5/00* (2006.01)
*H05K 3/22* (2006.01)
(Continued)

(52) U.S. Cl.
CPC ............... *B32B 27/20* (2013.01); *H01B 1/20* (2013.01); *B32B 2307/202* (2013.01);
(Continued)

(58) Field of Classification Search
CPC ...... H05K 5/0017; H05K 3/323; H05K 1/028; H05K 3/22; H05K 2201/10681; H01B 1/20; G02B 5/00; G02F 1/1345
See application file for complete search history.

(56) References Cited

U.S. PATENT DOCUMENTS 6,426,566 B1 * 7/2002 Sawamoto .............. H01L 24/29
257/783
2002/0003227 A1 1/2002 Kageyama et al.
(Continued)

FOREIGN PATENT DOCUMENTS

CN 1167219 A 9/2002
CN 1699492 A 11/2005
(Continued)

OTHER PUBLICATIONS

Office Action in Chinese Application No. 201510160916.8 dated Feb. 6, 2017, with English translation. 8 pages.
(Continued)

*Primary Examiner* — Cheng Yuan Huang
(74) *Attorney, Agent, or Firm* — Womble Bond Dickinson (US) LLP

(57) ABSTRACT

The present disclosure relates to an anisotropic conductive film, a display device and a reworking method thereof. The anisotropic conductive film comprises: a first resin layer having positively photosensitive characteristics and conductive particles distributed in the first resin layer. Since the first resin layer has positively photosensitive characteristics, it can be decomposed after the exposure process. In this case, when failures occur in the binding of the display panel with the external circuit by the anisotropic conductive film, the first resin layer in the anisotropic conductive film can be decomposed by performing an exposure process on the anisotropic conductive film, so as to separate the external circuit from the display panel for reworking of the display panel. In this way, no heating process is needed, which not only simplifies the reworking procedure, but also is suitable for the reworking of a flexible display panel.

18 Claims, 2 Drawing Sheets

(51) Int. Cl.
B32B 27/20 (2006.01)
H01B 1/20 (2006.01)

(52) U.S. Cl.
CPC ..... *B32B 2307/706* (2013.01); *B32B 2457/20* (2013.01); *H05K 2201/10681* (2013.01); *Y10T 428/25* (2015.01)

(56) References Cited

U.S. PATENT DOCUMENTS

| | | | | |
|---|---|---|---|---|
| 2007/0063347 | A1* | 3/2007 | Su | H01L 24/29 257/741 |
| 2010/0018755 | A1* | 1/2010 | Tatsuzawa | C09J 9/02 174/254 |

FOREIGN PATENT DOCUMENTS

| | | |
|---|---|---|
| CN | 1937216 A | 3/2007 |
| CN | 101724361 A | 6/2010 |
| CN | 101995673 A | 3/2011 |
| CN | 203133762 U | 7/2014 |
| CN | 104698689 A | 6/2015 |
| KR | 20080061492 A | 7/2008 |

OTHER PUBLICATIONS

International Search Report and Written Opinion in PCT/CN2015/085428 dated Jan. 18, 2016, with English translation. 15 pages.

* cited by examiner

ANISOTROPIC CONDUCTIVE FILM, DISPLAY DEVICE AND REWORKING METHOD THEREOF

The present application is the U.S. national phase entry of PCT/CN2015/085428, with an international filling date of Jul. 29, 2015, which claims the benefit to Chinese Patent Application No. 201510160916.8, filed on Apr. 7, 2015, the entire disclosures of which are incorporated herein by reference.

FIELD

The present disclosure relates to the field of display technologies, and in particular to an anisotropic conductive film, a display device and a reworking method thereof.

BACKGROUND ART

With continuous development of display technologies, flat panel displays such as light emitting diode (LED), organic light emitting diode (OLED), plasma display panel (PDP) and liquid crystal display (LCD) are evolving rapidly.

An existing flat panel display generally comprises a display panel and an external circuit, wherein the external circuit is electrically connected with pins on a substrate of the display panel so as to deliver a drive signal to each signal line on the display panel. The electrical connection of the external circuit with the pins on the substrate of the display panel is generally achieved by a crimping process with an anisotropic conductive film (ACF). However, various failures are likely to occur in the crimping process, for example, misalignment of the external circuit with the pins on the substrate of the display panel, non-conductivity of the ACF when an insulating layer cladding conductive particles in the ACF is not broken due to crimping insufficiency during the process, or poor conductive effects of the ACF when the insulating layer cladding part of the conductive particles in the ACF is not broken due to crimping unevenness during the process. The above failures may result in problems for the display panel such as non-display or abnormal display. In this case, it is necessary to strip the external circuit from the display panel so as to rework the flat panel display.

In an existing method for reworking a flat panel display, a crimping region is usually heated to melt the cured ACF, thereby separating the external circuit from the display panel. However, this method is quite complicated and inapplicable to a flexible display panel as it will damage the flexible display panel.

Therefore, how to provide a new reworking method is an urgent technical problem to be solved by those skilled in the art.

SUMMARY

To this end, an anisotropic conductive film, a display device and a reworking method thereof are provided in an embodiment of the present disclosure so as to provide a new reworking method.

Therefore, an anisotropic conductive film is provided in an embodiment of the present disclosure. The anisotropic conductive film comprises at least: a first resin layer having positively photosensitive characteristics and conductive particles distributed in the first resin layer. In a possible implementation, the anisotropic conductive film provided in an embodiment of the present disclosure further comprises: a second resin layer bonded with the first resin layer and having no photosensitive characteristic, and conductive particles distributed in the second resin layer.

In a possible implementation, in the anisotropic conductive film provided in an embodiment of the present disclosure, the thickness of the first resin layer is smaller than that of the second resin layer.

In a possible implementation, in the anisotropic conductive film provided in an embodiment of the present disclosure, the material for the first resin layer is a combination of one or more of a photosensitive resin, a polyimide resin doped with a diazo quinone compound, and polyethylene naphthalate doped with a diazo quinone compound.

A display device is further provided in an embodiment of the present disclosure. The display device comprises: a display panel and an external circuit. The display panel is electrically connected with the external circuit via the above anisotropic conductive film provided in an embodiment of the present disclosure.

In a possible implementation, in the display device provided in an embodiment of the present disclosure, the first resin layer in the anisotropic conductive film is in contact with the display panel.

In a possible implementation, in the display device provided in an embodiment of the present disclosure, the external circuit comprises: a flexible printed circuit, wherein the flexible printed circuit is electrically connected with the display panel via the anisotropic conductive film. Alternatively, the external circuit comprises: a printed circuit and a chip-on-film (COF), wherein the COF is electrically connected with the display panel via the anisotropic conductive film.

In a possible implementation, in the display device provided in an embodiment of the present disclosure, the display panel is a flexible display panel.

A reworking method for the above display device is further provided in an embodiment of the present disclosure. The reworking method comprises: performing an exposure process on a region in the display device corresponding to the anisotropic conductive film to decompose the first resin layer in the anisotropic conductive film; and separating the external circuit from the display panel electrically connected therewith via the anisotropic conductive film.

In a possible implementation, the method provided in an embodiment of the present disclosure further comprises: after the exposure process and prior to the separation of the external circuit from the display panel, treating the region in the display device corresponding to the anisotropic conductive film with a removing liquid.

In a possible implementation, in the method provided in an embodiment of the present disclosure, the removing liquid comprises: an alcohol solvent, an organic acid and a nonionic interfacial activator.

In a possible implementation, the method provided in an embodiment of the present disclosure further comprises: after the separation of the external circuit from the display panel, treating the display panel with an organic solvent.

In a possible implementation, in the method provided in an embodiment of the present disclosure, the step of performing an exposure process on a region in the display device corresponding to the anisotropic conductive film, when the first resin layer in the anisotropic conductive film makes contact with the display panel in the display device, comprises: performing an exposure process on a side of the display panel in the display device.

The present disclosure provides an anisotropic conductive film, a display device and a reworking method thereof. The anisotropic conductive film comprises: a first resin layer having positively photosensitive characteristics and conductive particles distributed in the first resin layer. The first resin layer can be decomposed after the exposure process, as it has positively photosensitive characteristics. In this case, when failures occur in the binding of the display panel with the external circuit by the anisotropic conductive film, the first resin layer in the anisotropic conductive film can be decomposed by performing an exposure process on the anisotropic conductive film, so as to separate the external circuit from the display panel for reworking of the display panel. In this way, no heating process is needed, which not only simplifies the reworking procedure, but also is suitable for the reworking of a flexible display panel.

DETAILED DESCRIPTION OF EMBODIMENTS

Figure 1:
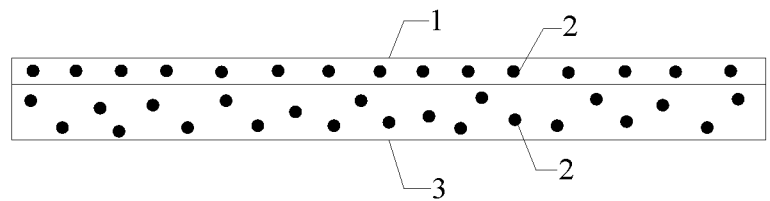
FIG. 1 is a schematic structural view for an anisotropic conductive film provided in an embodiment of the present disclosure.

The specific implementations of the anisotropic conductive film, the display device and the reworking method thereof provided in an embodiment of the present disclosure are described in detail as follows with reference to the drawings. For different reference signs in the drawings, 1 refers to a first resin layer, 2 refers to conductive particles, 3 refers to a second resin layer, 4 refers to a display panel, 5 refers to a external circuit, 6 refers to metal wires located on the display panel, 7 refers to metal wires located on the external circuit, and 8 refers to a void.

Shapes and thicknesses of each layer in the drawings do not reflect the real ratios, but instead, they are only provided for illustrating the basic principle of the present disclosure.

As shown in FIG. 1, the anisotropic conductive film provided in an embodiment of the present disclosure may comprise at least: a first resin layer 1 having positively photosensitive characteristics and conductive particles 2 distributed in the first resin layer 1.

In the anisotropic conductive film provided in an embodiment of the present disclosure, since the first resin layer has positively photosensitive characteristics, it can be decomposed after the exposure process. In this case, when failures occur in the binding of the display panel with the external circuit by the anisotropic conductive film, the first resin layer in the anisotropic conductive film can be decomposed by performing an exposure process on the anisotropic conductive film, so as to separate the external circuit from the display panel for reworking of the display panel. In this way, no heating process is needed, which not only simplifies the reworking procedure, but also is suitable for the reworking of a flexible display panel.

It should be noted that in the anisotropic conductive film provided in an embodiment of the present disclosure, the conductive particles distributed in the first resin layer can ensure that the anisotropic conductive film electrically connects the display panel with the external circuit during the binding of the display panel with the external circuit.

Optionally, as shown in FIG. 1, the anisotropic conductive film provided in an embodiment of the present disclosure, can further comprise: a second resin layer 3 bonded with the first resin layer 1 and having no photosensitive characteristic, and conductive particles 2 distributed in the second resin layer 3. The addition of the second resin layer 3 in the anisotropic conductive film can enhance the adhesive force of the anisotropic conductive film and avoid falling-off when binding the display panel with the external circuit by the anisotropic conductive film.

It should be noted that in the anisotropic conductive film provided in an embodiment of the present disclosure, the conductive particles distributed in the first resin layer and the conductive particles distributed in the second resin layer can ensure that the anisotropic conductive film electrically connects the display panel with the external circuit during the binding of the display panel with the external circuit.

Preferably, in the anisotropic conductive film provided in an embodiment of the present disclosure, in order to ensure that the first resin layer can be completely exposed so as to facilitate the separation of the external circuit from the display panel after the exposure process, as shown in FIG. 1, the thickness of the first resin layer 1 can be arranged to be smaller than that of the second resin layer 3. The reason for this is in that, it would be necessary to decompose the first resin layer by an exposure process so as to separate the external circuit from the display panel and rework the display device when failures occur in the binding of the display panel with the external circuit by the anisotropic conductive film.

Optionally, in the anisotropic conductive film provided in an embodiment of the present disclosure, the material for the first resin layer can be a photosensitive resin, i.e., a resin material containing a photosensitive group formed by chemical reactions. Alternatively, the material for the first resin layer can be made from the material for the second resin layer doped with a photosensitizer. Optionally, the material for the second resin layer can be a flexible material such as a polyimide resin (PI) or polyethylene naphthalate (PEN). Besides, the photosensitizer can be a diazo quinone compound or the like. Thus, the material for the first resin layer can be a combination of one or more of a polyimide resin doped with a diazo quinone compound, and polyethylene naphthalate doped with a diazo quinone compound, which will not be limited here.

It should be noted that in the anisotropic conductive film provided in an embodiment of the present disclosure, in order to prevent performances of the anisotropic conductive film from being affected by the decomposition of the first resin layer in a natural environment, the first resin layer is usually doped with a photosensitizer which is not sensitive to the natural light or a photosensitive group which is not sensitive to the natural light, in view of the fact that reactions can be induced to the photosensitizer or the photosensitive group in the first resin layer by irradiation of light with a corresponding wavelength. For example, the first resin layer can be doped with a photosensitizer which is sensitive to the UV light or a photosensitive group which is sensitive to the UV light. Alternatively, the first resin layer can be doped with a photosensitizer which is sensitive to the infrared light or a photosensitive group which is sensitive to the infrared light, which will not be limited here.

Based on a same inventive concept, a display device is further provided in an embodiment of the present disclosure.

Figure 2:
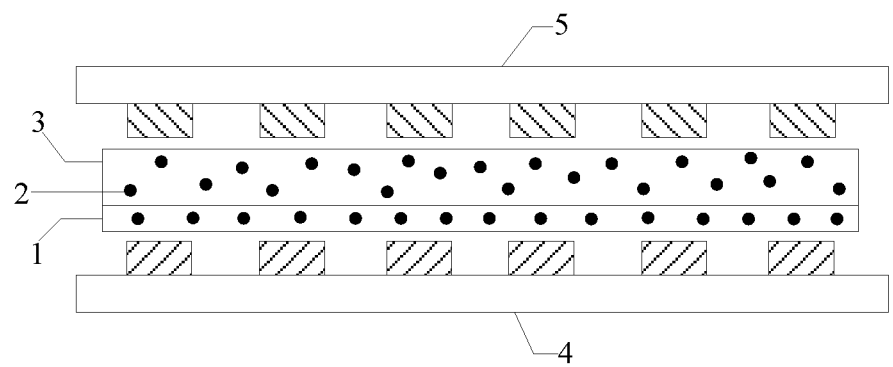
FIG. 2 is a schematic structural view for a display device provided in an embodiment of the present disclosure prior to the heat crimping process during binding.
Figure 3:
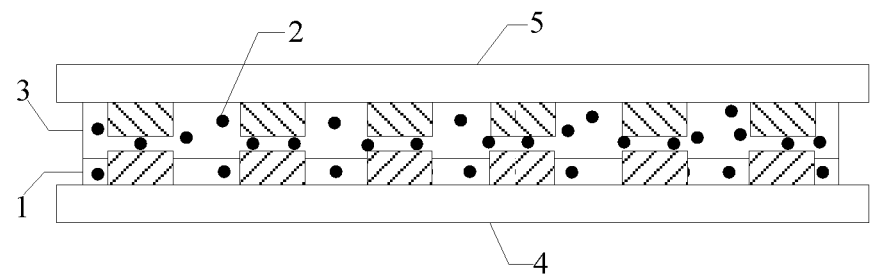
FIG. 3 is a schematic structural view for a display device provided in an embodiment of the present disclosure after the heat crimping process during binding.

As shown in FIGS. 2 and 3, the display device may comprises: a display panel 4 (only a binding region thereof is shown in FIGS. 2 and 3) and an external circuit 5. The display panel 4 is electrically connected with the external circuit 5 via the above anisotropic conductive film provided in an embodiment of the present disclosure. Explanations are provided in FIGS. 2 and 3, where the anisotropic conductive film for example comprises the second resin layer 3, the first resin layer 1 as well as the conductive particles 2 distributed in both the second resin layer 3 and the first resin layer 1. Specifically, FIG. 2 is a display device prior to the heat crimping process during binding and FIG. 3 is a display device after the heat crimping process during binding.

In the display device provided in an embodiment of the present disclosure, in view of the fact that the anisotropic conductive film for binding the display panel with the external circuit comprises a first resin layer having positively photosensitive characteristics, when failures occur in the binding of the display panel with the external circuit by the anisotropic conductive film, the first resin layer in the anisotropic conductive film can be decomposed by performing an exposure process on the anisotropic conductive film, so as to separate the external circuit from the display panel for reworking of the display panel. In this case, no heating process is needed, which not only simplifies the reworking procedure, but also is suitable for the reworking of a flexible display panel.

The display device provided in an embodiment of the present disclosure can be any product or component having a display function, such as a handset, a tablet computer, a TV, a display, a notebook computer, a digital photo frame, or a navigator. For the implementation of the display device, references can be made to the embodiments of the anisotropic conductive film, which will not repeated for simplicity.

Figure 4:
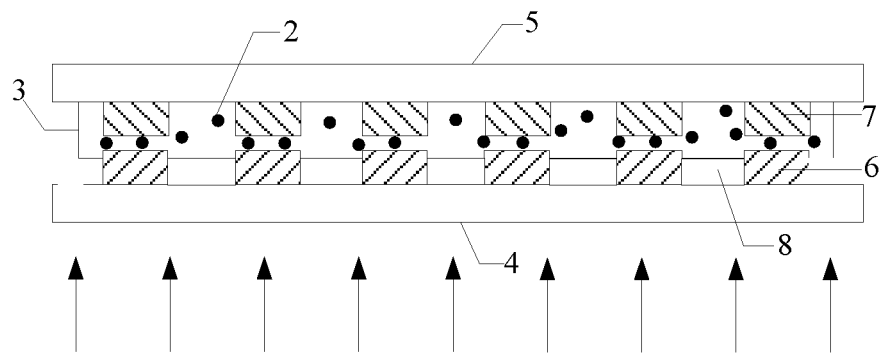
FIG. 4 is a schematic structural view for a display device provided in an embodiment of the present disclosure after the exposure process.

Preferably, in the display device provided in an embodiment of the present disclosure, no matter whether the anisotropic conductive film comprises only a first resin layer or both a second resin layer and a first resin layer, the first resin layer 1 in the anisotropic conductive film can be configured to make contact with the display panel 4, as shown in FIGS. 2 and 3, since the display panel has a better light transmittance than the external circuit. Also, as shown in FIG. 4, an exposure process can be performed on a side of the display panel 4 during exposure of the anisotropic conductive film (as indicated by the arrows in FIG. 4).

Obviously, the first resin layer in the anisotropic conductive film can also make contact with the external circuit. Besides, in order to ensure the exposure effect of the first resin layer, it is necessary to prolong the time duration of the exposure process, which will not be limited here.

Optionally, in the display device provided in an embodiment of the present disclosure, the external circuit can be a flexible printed circuit (FPC). The FPC is electrically connected with the display panel via the anisotropic conductive film. Alternatively, the external circuit can also comprise: a printed circuit (PC) and a chip-on-film (COF). Specifically, the printed circuit is electrically connected with the COF via the anisotropic conductive film, and the COF is electrically connected with the display panel via the anisotropic conductive film.

Obviously, in the display device provided in an embodiment of the present disclosure, the external circuit is not limited to a flexible printed circuit, or a printed circuit combined with a COF. It can further be any other circuit capable of loading a drive signal to the display panel, which will not be limited here.

Preferably, in the display device provided in an embodiment of the present disclosure, the display panel can be a flexible display panel, i.e., the anisotropic conductive film provided in an embodiment of the present disclosure is particularly suitable for a flexible display panel. When failures occur during the binding of the flexible display panel with the external circuit, only an exposure process is needed to separate the external circuit from the flexible display panel for reworking of the flexible display device. In this case, no heating process is needed, and no damage will be introduced to the flexible display panel.

Figure 5:
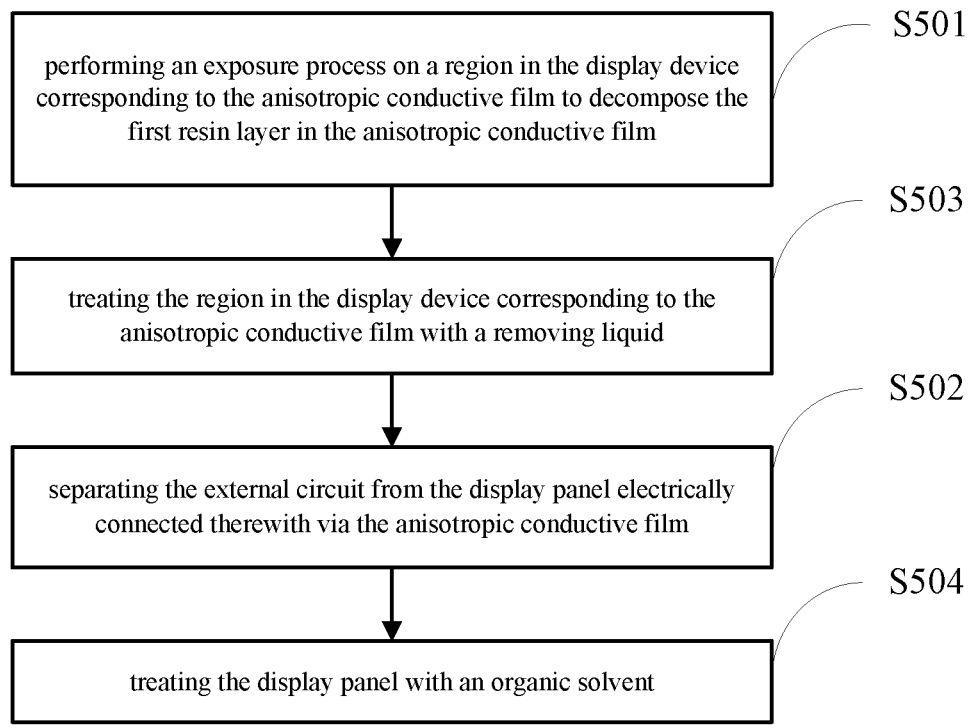
FIG. 5 is a flow chart of a reworking method for a display device provided in an embodiment of the present disclosure.

Based on a same inventive concept, a reworking method for the display device is further provided in an embodiment of the present disclosure. As shown in FIG. 5, the reworking method may comprise steps as follows.

S501, performing an exposure process on a region in the display device corresponding to the anisotropic conductive film to decompose the first resin layer in the anisotropic conductive film.

S502, separating the external circuit from the display panel electrically connected therewith via the anisotropic conductive film.

In the reworking method provided in an embodiment of the present disclosure, simply by performing an exposure process on a region in the display device corresponding to the anisotropic conductive film, the display panel in the display device can be separated from the external circuit. In this way, reworking of the display device without a heating process is facilitated, which not only simplifies the reworking procedure, but also is suitable for the reworking of a flexible display panel.

It should be noted that in the reworking method provided in an embodiment of the present disclosure, in view of the fact that reactions can be inducted to the photosensitizer or the photosensitive group in the first resin layer by irradiation of light with a corresponding wavelength, in order to prevent performances of the anisotropic conductive film from being affected by the decomposition of the first resin layer in a natural environment, the first resin layer is usually doped with a photosensitizer which is not sensitive to the natural light or a photosensitive group which is not sensitive to the natural light. For example, the first resin layer can be doped with a photosensitizer which is sensitive to the UV light or a photosensitive group which is sensitive to the UV light. Alternatively, the first resin layer can be doped with a photosensitizer which is sensitive to the infrared light or a photosensitive group which is sensitive to the infrared light, which will not be limited here.

Optionally, for example, as shown in FIG. 4, during the step S501 of performing an exposure process on a region in the display device corresponding to the anisotropic conductive film in the method provided in an embodiment of the present disclosure, the first resin layer in the anisotropic conductive film sandwiched between metal wires 6 located on the display panel 4 and metal wires 7 located on the external circuit 5 will not be readily decomposed due to shield by the metal wires 6 located on the display panel 4. Therefore, as shown in FIG. 5, after the step S501 of performing an exposure process on a region in the display device corresponding to the anisotropic conductive film in the method provided in an embodiment of the present disclosure, and prior to the step S502 of separating the external circuit from the display panel in the method provided in an embodiment of the present disclosure, the following step can be further comprised.

S503, treating the region in the display device corresponding to the anisotropic conductive film with a removing liquid. In this way, the anisotropic conductive film sandwiched between the metal wires 6 located on the display panel 4 and the metal wires 7 located on the external circuit 5 can be removed, allowing the external circuit 5 to be readily detached from the display panel 4. Preferably, the removing liquid can be injected into a void 8 (formed after decomposition of the first resin layer being exposed) from an edge of the display device. Obviously, the display device can be treated in other manners by taking advantage of the anisotropic conductive film, which will not be limited here.

Optionally, in the reworking method provided in an embodiment of the present disclosure, the removing liquid can comprise: an alcohol solvent, an organic acid, a nonionic interfacial activator and so on. Obviously, components of the removing liquid are not limited thereto.

Optionally, after the step S502 of separating the display panel from the external circuit in the method provided in an embodiment of the present disclosure, a residue after decomposition of the first resin layer is left on a binding region of the display panel. Therefore, as shown in FIG. 5, after the step S502 of separating the display panel from the external circuit in the method provided in an embodiment of the present disclosure, the following step can further be comprised.

S504, treating the display panel with an organic solvent. Preferably, the binding region of the display panel can be gently wiped by alcohol. In this way, a good condition for the next binding will be provided.

Optionally, in the reworking method provided in an embodiment of the present disclosure, the first resin layer in the anisotropic conductive film can be configured to make contact with the display panel in the display device, since the display panel has a better light transmittance than the external circuit. Besides, an exposure process can be performed on a side of the display panel during the step S501 of performing an exposure process on a region in the display device corresponding to the anisotropic conductive film in the method provided in an embodiment of the present disclosure. In this way, a good exposure effect of the first resin layer will be ensured.

Obviously, the first resin layer in the anisotropic conductive film can also make contact with the external circuit. Also, in order to ensure the exposure effect of the first resin layer, it is necessary to prolong the time duration of the exposure process, which will not be limited here.

The present disclosure provides an anisotropic conductive film, a display device and a reworking method thereof. The anisotropic conductive film comprises: a first resin layer having positively photosensitive characteristics, and conductive particles distributed in the first resin layer. The first resin layer can be decomposed after the exposure process, as it has positively photosensitive characteristics. In this case, when failures occur in the binding of the display panel with the external circuit by the anisotropic conductive film, the first resin layer in the anisotropic conductive film can be decomposed by performing an exposure process on the anisotropic conductive film, so as to separate the external circuit from the display panel for reworking of the display panel. In this way, no heating process is needed, which not only simplifies the reworking procedure, but also is suitable for the reworking of a flexible display panel.

Obviously, those skilled in the art can make various modifications and variations to the embodiments of the present disclosure without deviating from the spirit and scope of the present disclosure. Thus if these modifications and variations to the present disclosure fall within the scope of the claims of the present disclosure and the equivalent techniques thereof, the present disclosure is intended to include them too.

The invention claimed is:

1. An anisotropic conductive film, comprising at least:
a first resin layer consisting of a first material, said first resin layer comprises a first side and a second side opposite to the first side, wherein the first resin layer is decomposed after being exposed to UV light or infrared light,
conductive particles distributed in the first resin layer,
a second resin layer consisting of a second material, said second resin layer comprises a third side and a fourth side opposite to the third side, wherein the second resin layer is bonded with the first resin layer and has no photosensitive characteristic, and
conductive particles distributed in the second resin layer,
wherein the first side is connected with a display panel, the second side is connected with the third side, the fourth side is connected with an external circuit, and the first material is made by doping a photosensitizer in the second material.

2. The anisotropic conductive film according to claim 1, wherein
the thickness of the first resin layer is smaller than that of the second resin layer.

3. The anisotropic conductive film according to claim 1, wherein
the first material for the first resin layer comprises at least one member selected from the group consisting of a photosensitive resin, a polyimide resin doped with a diazo quinone compound, and polyethylene naphthalate doped with a diazo quinone compound.

4. A display device, comprising:
a display panel, and
an external circuit,
wherein the display panel is electrically connected with the external circuit via an anisotropic conductive film comprising at least:
a first resin layer consisting of a first material, said first resin layer comprises a first side and a second side opposite to the first side, wherein the first resin layer is decomposed after being exposed to UV light or infrared light,
conductive particles distributed in the first resin layer,
a second resin layer consisting of a second material, said second resin layer comprises a third side and a fourth side opposite to the third side, wherein the second resin layer is bonded with the first resin layer and has no photosensitive characteristic, and
conductive particles distributed in the second resin layer,
wherein the first side is connected with the display panel, the second side is connected with the third side, the fourth side is connected with the external circuit, and the first material is made by doping a photosensitizer in the second material.

5. The display device according to claim 4, wherein
the first resin layer in the anisotropic conductive film is in contact with the display panel.

6. The display device according to claim 4, wherein
the external circuit comprises a flexible printed circuit, the flexible printed circuit being electrically connected with the display panel via the anisotropic conductive film; or
the external circuit comprises a printed circuit and a chip-on-film, the chip-on-film being electrically connected with the display panel via the anisotropic conductive film.

7. The display device according to claim 6, wherein
the first resin layer in the anisotropic conductive film is in contact with the display panel.

8. The display device according to claim 4, wherein the display panel is a flexible display panel.

9. The display device according to claim 8, wherein
the first resin layer in the anisotropic conductive film is in contact with the display panel.

10. The display device according to claim 4, wherein
the thickness of the first resin layer is smaller than that of the second resin layer.

11. The display device according to claim 4, wherein
the first material for the first resin layer comprises at least one member selected from the group consisting of a photosensitive resin, a polyimide resin doped with a diazo quinone compound, and polyethylene naphthalate doped with a diazo quinone compound.

12. A reworking method for the display device according to claim 4, comprising:
performing an exposure process on a region in the display device corresponding to the anisotropic conductive film to decompose the first resin layer in the anisotropic conductive film; and
separating the external circuit from the display panel electrically connected therewith via the anisotropic conductive film.

13. The method according to claim 12, further comprising:
after the exposure process and prior to the separation of the external circuit from the display panel, treating the region in the display device corresponding to the anisotropic conductive film with a removing liquid.

14. The method according to claim 13, wherein
the removing liquid comprises an alcohol solvent, an organic acid and a nonionic interfacial activator.

15. The method according to claim 12, further comprising:
after the separation of the external circuit from the display panel, treating the display panel with an organic solvent.

16. The method according to claim 15, further comprising:
after the exposure process and prior to the separation of the external circuit from the display panel, treating the region in the display device corresponding to the anisotropic conductive film with a removing liquid.

17. The method according to claim 12, wherein
when the first resin layer in the anisotropic conductive film is in contact with the display panel in the display device, the step of performing an exposure process on a region in the display device corresponding to the anisotropic conductive film comprises: performing an exposure process on a side of the display panel in the display device.

18. The method according to claim 17, further comprising:
after the exposure process and prior to the separation of the external circuit from the display panel, treating the region in the display device corresponding to the anisotropic conductive film with a removing liquid.

* * * * *